(12) United States Patent
Kuo et al.

(10) Patent No.: US 6,620,722 B2
(45) Date of Patent: Sep. 16, 2003

(54) BUMPING PROCESS

(75) Inventors: Wen-Chang Kuo, Hsin-Chu (TW); Szu-Yao Wang, Chiunglin Shiang (TW)

(73) Assignee: Taiwan Semiconductor Manufacturing Co., Ltd, Hsun Chu (TW)

( * ) Notice: Subject to any disclaimer, the term of this patent is extended or adjusted under 35 U.S.C. 154(b) by 0 days.

(21) Appl. No.: 09/886,834

(22) Filed: Jun. 21, 2001

(65) Prior Publication Data

US 2002/0197842 A1 Dec. 26, 2002

(51) Int. Cl.$^7$ .............................................. H01L 21/44
(52) U.S. Cl. ..................................... 438/613; 228/111.5
(58) Field of Search ....................... 228/111.5; 438/614, 438/612, 613

(56) References Cited

U.S. PATENT DOCUMENTS

| | | | | |
|---|---|---|---|---|
| 5,377,961 A | * | 1/1995 | Smith et al. ................. | 222/590 |
| 6,013,381 A | * | 1/2000 | Bobbio et al. .............. | 428/628 |
| 6,138,894 A | * | 10/2000 | Ulmer ...................... | 228/111.5 |
| 6,350,494 B1 | * | 2/2002 | Farnworth ................. | 239/11 |

OTHER PUBLICATIONS

Harper et al., "Electronic Packanging And Interconnection Handbook" 1991, McGraw–Hill, pp. 5.21.*

* cited by examiner

*Primary Examiner*—William David Coleman
(74) *Attorney, Agent, or Firm*—Tung & Associates

(57) ABSTRACT

A process of forming a solder bump on a semiconductor device including vibrating a solder reservoir carrier in a vertical direction while pressure and heat are applied to the solder reservoir. An engagement surface of the solder reservoir is contacted with an engagement surface of the semiconductor device and the semiconductor device is vibrated in a horizontal direction to reflow a portion of the solder reservoir on the engagement surface. The solder reservoir carrier and the semiconductor device are moved away from each other so that additional solder is deposited and a solder column is grown on the semiconductor device. The solder column is cut off from the solder reservoir by vibrating the solder reservoir carrier in a horizontal direction to form a solder bump on the semiconductor device.

23 Claims, 3 Drawing Sheets

BUMPING PROCESS

FIELD OF THE INVENTION

This invention relates to the process of forming a solder bump on the substrate.

BACKGROUND OF THE INVENTION

A flip chip microelectronic assembly includes a direct electrical connection of face down (that is, "flipped") electronic components onto substrates, such as ceramic substrates, circuit boards, or carriers using conductive bump bond pads of the chip. Flip chip technology is quickly replacing older wire bonding technology that uses face up chips with the wire connected to each pad on the chip.

The flip chip components used in flip chip microelectronic assemblies are predominantly semiconductor devices, however, components such as passive filters, detector arrays, and MEM devices are also being used in flip chip form. Flip chips are also known as "direct chip attach," because the chip is directly attached to the substrate, board, or carrier by the conductive bumps.

The use a flip chip packaging has dramatically grown as a result of the flip chips advantages in size, performance, flexibility, reliability, and cost over other packaging methods and from the widening availability of flip chip materials, equipment and services. In some cases, the elimination of old technology packages and bond wires may reduce the substrate or board area needed to secure the device by up to 25 percent, and may require far less height. Further, the weight of the flip chip can be less than 5 percent of the old technology package devices.

Flip chips are advantageous because of their high-speed electrical performance when compared to other assembly methods. Eliminating bond wires reduces the delay in inductance and capacitance of the connection, and substantially shortens the current path resulted in the high speed off-chip interconnection.

Flip chips also provide the greatest input/output connection flexibility. Wire bond connections are generally limited to the perimeter of the chip or die, driving the die sizes up as a number of connections have increased over the years. Flip chip connections can use the whole area of the die, accommodating many more connections on a smaller die. Further, flip chips can be stacked in 3-D geometries over other flip chips or other components.

Flip chips also provided the most rugged mechanical interconnection. Flip chips when underfilled with an adhesive such as an epoxy, can withstand the most rugged durability testing. In addition to providing the most rugged mechanical interconnection, flip chips can be the lowest cost interconnection for high-volume automated production. The bumps of the flip chip assembly serve several functions. The bumps provided an electrical conductive path from the chip (or die) to the substrate on which the chip is mounted. A thermally conductive path is also provided by the bumps to carry heat from the chip to the substrate. The bumps also provided part of the mechanical mounting of the chip to the substrate. A spacer is provided by the bumps that prevents electrical contact between the chip and the substrate connectors. Finally, the bumps act as a short lead to relieve mechanical strain between the chip and the substrate.

Flip chips are typically made by a process including placing solder bumps on a silicon wafer. The solder bump flip chip processing typically includes four sequential steps: 1) preparing the wafer for solder bumping; 2) forming or placing the solder bumps on the wafer; 3) attaching the solder bumped die to a board, substrate or carrier; and 4) completing the assembly with an adhesive underfill. A brief description of the prior art methods of performing the first step will provide a better background for understanding the present invention.

The first step in a typical solder bumping process involves preparing the semiconductor wafer bumping sites on bond pads of the individual integrated circuits defined in the semiconductor wafer. The preparation may include cleaning, removing insulating oxides, and preparing a pad metallurgy that will protect the integrated circuits while making good mechanical and electrical contact with the solder bump. Accordingly, protective metallurgy layers may be provided over the bond pad. Ball limiting metallurgy (BLM) or under bump metallurgy (UBM) generally consists of successive layers of metal. The "adhesion" layer must adhere well to both the bond pad metal and the surrounding passivation, provide a strong, low-stress mechanical and electrical connection. The "diffusion barrier" layer prevents the diffusion of solder into the underlying material. The "solder wettable" layer provides a wettable surface for the molten solder during the solder bumping process, for good bonding of the solder to the underlying metal.

In fabrication a flip-chip bond structure, the fabrication process requires a tight control of interface processes and manufacturing parameters in order to meet very small dimensional tolerances. Various techniques may be utilized to fabricate a UBM structure and to deposit the solder bump. A few widely used methods of depositing bumps include evaporation, electroplating, electroless plating and screen-printing. Kung et al, U.S. Pat. No. 6,179,200 provides a description of these more widely used methods of depositing bumps as follows. The formation of solder bumps can be carried out by an evaporation method of Pb and Sn through a mask for producing the desired solder bumps. When a metal mask is used, UBM metals and solder materials can be evaporated through designated openings in the metal mask and be deposited as an array of pads onto the chip surface.

In the evaporation method, a wafer is first passivated with an insulating layer, via holes are then etched through the wafer passivation layer which is normally $SiO_2$ to provide a communication path between the chip and the outside circuit. After a molybdenum mask is aligned on the wafer, a direct current sputtering cleans the via openings formed in the passivation layer and removes undesirable oxides. A cleaned via opening assures low contact resistance and good adhesion to the $SiO_2$. A chromium layer is evaporated through a metal mask to form an array of round metal pads each covering an individual via to provide adhesion to the passivation layer and to form a solder reaction barrier to the aluminum pad underneath. A second layer of chromium/copper is then co-evaporated to provide resistance to multiple reflows. This is followed by a final UBM layer of pure copper which forms the solderable metallurgy. A thin layer of gold may optionally be evaporated to provide an oxidation protection layer. These metal-layered pads define the solder wettable regions on the chips, which are commonly referred to as the ball limiting metallurgy (BLM) or under bump metallurgy (UBM). After the completion of UBM, solder evaporation occurs through a metal mask, which has a hole diameter slightly greater than the UBM mask-hole diameter. This provides the necessary volume for forming a subsequent solder ball. A solder reflow process is performed at a temperature of about 350 degrees Celsius to melt and homogenize the evaporated metal pad and to impart a truncated spherical shape to the solder bump. The evaporation method, even though well established and has been practiced for a long time in the industry, is a slow process and thus can not be run at high throughput rate.

A second method for forming solder bumps is the electroplating method. In an electroplating process, UBM layers are first deposited, followed by the deposition of a photoresist layer, the patterning of the photoresist layer, and then the electro-deposition of a solder material into the photoresist openings. After the electro-deposition process is completed, the photoresist layer can be removed and the UBM layers can be etched by using the plated solder bumps as a mask. The solder bumps are then reflowed in a furnace reflow process. The photolithography/electroplating technique is a simpler technique than evaporation and is less expensive because only a single masking operation is required. However, electroplating requires the deposition of a thick and uniform solder over a hole wafer area and etching metal layers on the wafer without damaging the plated solder layer. The technique of electroless plating may also be used to form UBM structure.

Another solder bump formation technique that is capable of solder-bumping a variety of substrates is a solder paste screening method. The screen printing technique can be used to cover the entire area of an 8-inch wafer. In this method, a wafer surface covered by a passivation layer with bond pads exposed is first provided. UBM layers are then deposited on top of the bond pads and the passivation layer. After the coating of a photoresist layer and the patterning of the layer, the UBM layers are etched followed by stripping off the photoresist layer. A stencil is then aligned on the wafer and solder paste is squeegeed through the stencil to fill the openings on top of the bond pads and the UBM layers. After the stencil is removed, the solder bumps may be reflowed in a furnace to form solder balls.

One drawback of the solder paste screen printing process is that, with the recent trend in the miniaturization of device dimensions and the reduction in bump to bump spacing (or pitch), the prior art solder paste screening techniques become impractical. For instance, one of the problems in applying solder paste screening technique to modern IC devices is the paste composition itself. A paste in generally composed of a flux and solder alloy particles. The consistency and uniformity of the solder paste composition becomes more difficult to control with a decreasing solder bump volume. A possible solution for this problem is the utilization of solder paste that contains extremely small and uniform solder particles. However, this can only be achieved at a very high cost penalty. Another problem is using the solder paste screening technique in modern high-density devices is the reduced pitch between bumps. Since there is a large reduction in volume from a paste to the resulting solder bump, the screen holes must be significantly larger in diameter than the final bumps. It is therefore generally desirable to form solder bumps that are reflown into solder balls with a larger height and a larger pitch between the balls.

Several other methods are known to those skilled in the art for producing solder bumps on a semiconductor device. One such method is called the solder jet printing method. The solder jet printer method is based upon piezoelectric demand mode ink jet printing technology and is capable of producing and placing molten solder droplets 25–125 micrometers in diameter at rates of up to 2000 per second. In demand mode inkjet printing systems, a volumetric change in the fluid is induced either by the displacement of piezoelectric material that is coupled to the fluid or by the formation of the vapor bubble in the ink caused by heating a resistive element. The volumetric change causes pressure transience to occur in the fluid, and these are directed so as to produce a drop that issues from an orifice. A droplet is created only when it is desired in demand mode systems. Demand mode inkjet printing produces droplets that are approximately equal to the orifice diameter of the droplet generator.

Another method for producing solder bumps is known as the micro-punching method. In the micro-punching method, solder tape is supplied from a spool and rolled up by a motor driven spool. A micro-punch is driven by an electric actuator and a displacement enlarging mechanism. A micro-punch and die set blanks a thin solder tape and forms a small cylindrical piece. A solder flux may be formed over the entire semiconductor wafer to be bumped and the solder pieces may be punched and placed directly onto the wafer.

In practicing the flip-chip bonding technology, it has also been found that the fatigue life of the solder ball joint is directly proportional to the height of the solder bumps (or solder balls after reflow). It is therefore desirable to increase the height of the solder balls during the fabrication process of the solder bumps and during the reflow process for the solder balls. Such increase in the height of the solder balls directly increases the fatigue life of a solder ball joint established between a flip-chip and a substrate.

These techniques, and particularly the three widely used prior art techniques as described above for fabricating solder bumps, i.e., the evaporation method, the electroplating method, and the print screening method all have deficiencies and shortcomings with respect to either number of process steps, time required to complete the process, throughput, cost of fabrication, solder bump height and/or pitch limitations. The present invention overcomes some of the deficiencies of the prior art and provides advantages and alternatives there to.

SUMMARY OF THE INVENTION

Figure 1:
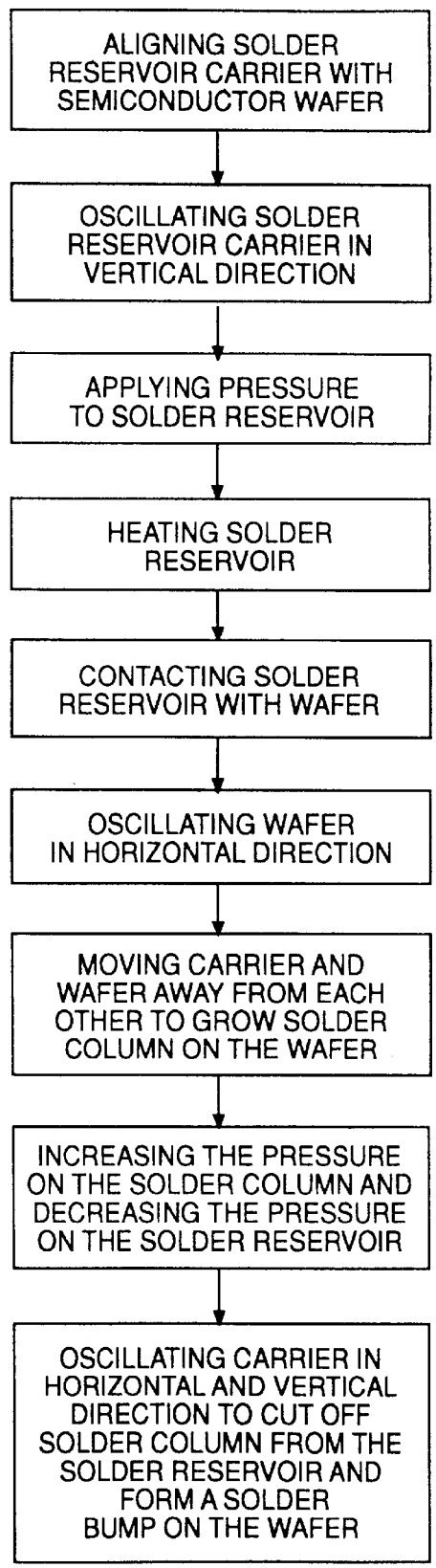
FIG. 1 is a process flow chart illustrating one embodiment of the present invention.

The invention includes a method of making solder bumps on a substrate. In one embodiment, the invention includes a process of providing a solder reservoir and a substrate having a solder contact thereon. The solder reservoir is aligned with the solder contact. Thereafter, solder is deposited from the solder reservoir onto the solder contact by steps including oscillating the solder reservoir at an ultrasonic frequency.

Another embodiment of the invention includes a process of providing a solder reservoir, and providing a substrate and having a solder contact thereon. The solder reservoir is aligned with the solder contact. Thereafter solder is deposited from the solder reservoir onto the solder contact by steps including oscillating the solder reservoir at an ultrasonic frequency. The substrate and the solder reservoir moved further away from each other while continuing to carry out the step of oscillating the solder reservoir at an ultrasonic frequency so that a solder column is formed on the solder contact. The solder column is cut off from the solder reservoir to form a solder bump on the solder contact on the substrate.

Another embodiment of the invention further includes step of providing a solder reservoir carrier having a generally flat configuration and having an upper face the lower face and an aperture form therethrough. At least a portion of the solder reservoir is received in the aperture. The step of oscillating the solder reservoir is carried out by oscillating the solder reservoir carrier.

In another embodiment of the invention the step of providing a solder reservoir further includes providing an engagement portion of the solder reservoir extending below the lower face of the solder reservoir carrier.

In an another embodiment of the invention the substrate has a substantially flat configuration and the step of cutting off the solder column from the solder reservoir includes oscillating the substrate at an ultrasonic frequency and in a horizontal direction generally parallel with a plane of the substrate.

Another embodiment of the invention further includes the step of applying pressure to the solder reservoir while carrying out the step of oscillating the solder reservoir at an ultrasonic frequency.

In another embodiment of the invention the solder reservoir includes a solder paste that includes lead and tin.

Another embodiment of the invention further includes a plurality of solder reservoirs, and wherein the substrate includes a plurality of solder contacts and wherein each solder reservoir has an associated solder contact for carrying out the steps of aligning and depositing.

In another embodiment of the invention the step of moving the solder reservoir carrier and the second substrate away from each other is carried out at a rate of about 1–100 micrometers per second.

Another embodiment of the invention further includes a solder mask having a tapered through hole and wherein at least a portion of the solder reservoir is received in the through hole. Another embodiment of the invention includes a process of providing a solder reservoir carrier including a substrate having generally flat configuration and upper face lower face and an aperture form through the first substrate. A solder mask is provided having at least a portion received in the aperture and having a lower face and a funnel shaped through hole form through the mask and extending through the lower face of the mask. A solder reservoir is provided having at least a portion received in the final shaped through hole of the mask and having an engagement portion extending below the lower face of the mask. A second substrate having solder contact thereon is also provided. The engagement portion is aligned with the solder contact. Thereafter the solder reservoir carrier is oscillated at a ultrasonic frequency and in a vertical direction generally perpendicular to the plane of the first substrate. The engagement portion of the solder reservoir is contacted with the solder contact on the second substrate. The second substrate is oscillated at an ultrasonic frequency and in a horizontal direction generally parallel to the plane of the second substrate to reflow a portion of the solder reservoir onto the solder contact of the second substrate. Thereafter the oscillation of the second substrate stopped. The solder reservoir carrier and the second substrate are moved further away from each other and the step of oscillating the solder reservoir carrier in a vertical direction is continued so that additional solder is deposited on the second substrate and a solder column is formed on the solder contact. The solder column is cut off from the solder reservoir to form a solder bump on the solder contact.

In another embodiment of the invention the step of cutting off the solder column includes oscillating the solder reservoir carrier in a horizontal direction generally parallel with the plane of the solder reservoir carrier.

In another embodiment that the invention the step of cutting off the solder column from the solder reservoir includes the step of applying pressure to the solder column.

Another embodiment of the invention further includes the step of applying pressure to the solder reservoir while carrying out the step of oscillating the solder reservoir carrier in a vertical direction.

In another embodiment of the invention the step of moving the solder reservoir carrier and the second substrate away from each other is carried out at a rate of about 1–100 micrometers per second.

In another embodiment of the invention the step of cutting off the solder column from the solder reservoir includes oscillating the solder reservoir carrier at an ultrasonic frequency in both a vertical and a horizontal direction.

In another embodiment of the invention the solder reservoir comprises a solder paste including lead and tin.

In another embodiment of the invention the second substrate includes a semiconductor wafer.

In another embodiment of the invention the second substrate includes a semiconductor wafer and a solder contact including a contact pad formed on the semiconductor wafer and an under bump metallurgy over the contact pad.

Another embodiment of the invention includes a process of providing a solder reservoir carrier including the first substrate having a generally flat configuration and having an upper face lower face and an aperture form through the first substrate. A solder mask is provided having at least a portion in received in the aperture and having a lower face and a funnel shaped through hole form through the mask and extending through the lower face of the mask. A solder reservoir is provided having at least a portion received in the funnel shaped through hole of the mask and having an engagement portion extending below the lower face of the mask. A semiconductor wafer is provided having a solder contact thereon. A first process chamber defined by a first set of walls, and a second process chamber defined by a second set of walls are also provided. The solder reservoir carrier is received in the first process chamber and the semiconductor wafer is received in the second process chamber. The solder reservoir and the semiconductor wafer are aligned so that the engagement portion of the solder reservoir overlies the solder contact of the semiconductor wafer. The solder reservoir carrier is oscillated at an ultrasonic frequency and in a direction generally perpendicular to the plane of the first substrate. Pressure is applied to the solder reservoir by increasing pressure in the first process chamber. The engagement portion of the solder reservoir is contacted with the solder contact on the semiconductor wafer. The semiconductor wafer is oscillated at an ultrasonic frequency and in a horizontal direction generally parallel to the plane of the semiconductor wafer to reflow a portion of the solder reservoir onto the solder contact on the semiconductor wafer. Thereafter the step of oscillating the semiconductor wafer is stopped. The semiconductor wafer is moved away from the solder reservoir carrier and the step of oscillating the solder reservoir carrier in a vertical direction is continued and pressure is applied to the solder reservoir so that additional solder is deposited on the semiconductor wafer and a solder column is formed on the solder contact. The solder column is cut off from the solder reservoir to form a solder bump on the solder contact by oscillating the solder reservoir carrier in both a vertical and a horizontal direction, and by reducing the pressure in the first process chamber and increasing pressure in the second process chamber so that the pressure in the second process chamber is greater than the pressure in the first process chamber.

In an another embodiment of the invention the solder reservoir includes a solder paste.

In another embodiment of the invention the step of moving the semiconductor wafer away from the solder reservoir carrier is carried out at rate ranging from about 1–100 micrometers per second.

These and other objects, features and advantages of the present invention will become more apparent from the following detailed description of preferred embodiments, and appended claims and drawings.

DETAILED DESCRIPTION OF PREFERRED EMBODIMENTS

FIG. 1 is a flow chart of one embodiment of a process according to present invention. According to the present invention, solder bumps may be grown on a substrate such as a semiconductor wafer by aligning a solder reservoir carrier with the semiconductor wafer. The solder reservoir carrier is vibrated or oscillated in a vertical direction and pressure may be applied to the solder reservoir. The pressure may be applied by mechanical means such as a ram pressing down on the top of the solder reservoir or the pressure may be applied by increasing the pressure in a process chamber enclosing the solder reservoir carrier. The solder reservoir may be heated by direct contact with a mechanical heating element or the temperature of the atmosphere and the process chamber surrounding the solder reservoir carrier may be raised by means known to those skilled in the art. Thereafter the solder reservoir is contacted with the semiconductor wafer. The semiconductor and wafer is oscillated in a horizontal direction to reflow the solder contacting the semiconductor wafer. The carrier and the semiconductor wafer are moved away from each other to allow additional solder to be deposited and to grow or form a solder column on the semiconductor wafer. When the solder column has reached a desirable height, the solder column is cut off from the solder reservoir by changing the applied pressure on the solder column and the solder reservoir, and by oscillating the carrier in a horizontal and a vertical direction to cut off the solder column from the solder reservoir and form a solder bump.

FIGS. 2A–D illustrate one embodiment of a process according to the present invention. A solder material process chamber or first chamber 10 may be provided and defined by a first set of walls 12 that surround a solder reservoir carrier 14. The carrier 14 may include a first substrate 16 which is substantially flat having an upper flat face 18 and an opposite lower flat face 20. Preferably the first substrate 16 includes an aperture 22 formed therethrough for receiving at least a portion of a solder reservoir 24. The carrier 14 may also include a mask 26 received in the aperture 22 defined in the first substrate 16. The mask 26 preferably has a lower face 28 that is flush with the lower face 20 of the first substrate 16. The mask 26 may have outer sidewalls 30 that extend upward above the upper face 18 of the first substrate 16. The mask 26 may also include an upper flat face 32. A through hole is formed in the mask 26 and may be defined at least partially by a tapered side wall or walls 36 that extend from the upper face 32 of the mask to the lower face 28 of the mask so that the upper opening of the through hole near the upper face 32 of the mask has a greater cross-sectional area than the lower opening of the through hole near the lower face 28 of the mask. Preferably the through hole is defined by a single tapered side wall 36 to define a conical shaped (tapered) through hole that facilitates the flow of a substantial amount of solder through the mask and also allows for a narrower pitch between adjacent bumps defined on the semiconductor wafer.

The solder reservoir 24 is supported by the carrier 14 wherein at least a portion, a middle portion, of the solder reservoir 24 is received in the through hole defined in the mask 26 and an upper portion extends above the mask 26. A wafer engagement portion 54 of the solder reservoir extends downwardly below the lower face 28 of the mask and the lower face 20 of the first substrate 16. The solder reservoir 24 is a solder paste of any type known to those skilled in the art and may include for example, 5–63 weight percent S.n. and from 37–95 weight percent Pb.

A second chamber 50 may be provided and defined by a second set of walls 52 that surrounding a second substrate 38. The second substrate 38 may include a semiconductor wafer 40 and which may have a contact pad 42, such as an aluminum contact pad, defined on an upper surface 44 of the semiconductor wafer 40. A passivation layer 46 may be defined over portions of the upper surface 44 of the wafer 40. Preferably an under bump metallurgy (UBM) 48 is formed over the contact pad 42. As indicated above, the under bump metallurgy 48 may consist of successive layers of metal including an adhesion layer that adheres well to both the contact pad 42 and the surrounding passivation 46. A diffusion barrier may be provided over the adhesion layer to prevent diffusion of solder into the underlying material. A solder wettable layer over the diffusion barrier layer provides a wettable surface for the molten solder during the solder bumping process. There are a variety of combinations of metal layers for the UBM that are known to those skilled in the art including Cr—Cu—Au, Al—NiV—Cu, Ni—Cu, and Ni—Au.

Figure 2A:
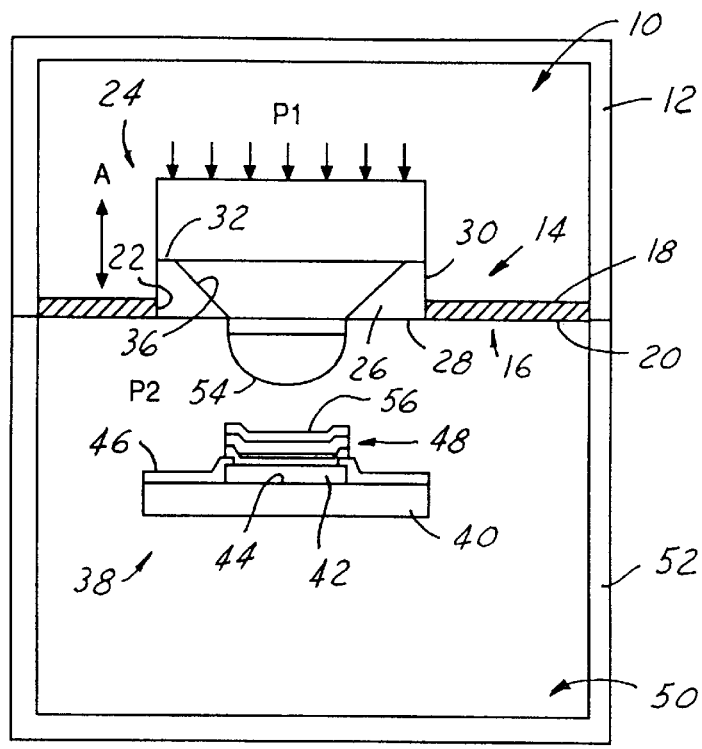
FIG. 2A is an enlarged, sectional view illustrating the alignment of a solder reservoir carrier and a semiconductor wafer according to the present invention.

As shown in FIG. 2A the solder reservoir carrier 14 is aligned with the second substrate 38 so that solder may be deposited in a desired location on the second substrate 38. Preferably the engagement portion 54 of the solder reservoir 24 is aligned with the contact pad 42 on the semiconductor wafer 40 and aligned with the UBM 48 if present.

Once the carrier 14 is aligned with the second substrate 38, the carrier 14 is vibrated or oscillated at an ultrasonic frequency and in a vertical direction (as shown by arrows A) generally in a plane perpendicular to the plane of the flat carrier 14. At the same time, the temperature of the solder reservoir may be increased by direct contact with a heating element or by increasing the temperature of the atmosphere in the chamber 10. Pressure may be applied to the upper portion of the solder reservoir in a direction indicated by arrows P1 in FIG. 2A. The pressure may be applied by a mechanical ram or by increasing the pressure of the atmosphere in the first chamber 10. The pressure in the first chamber 10 may be increased from about one atmosphere to about five atmospheres. Preferably the pressure in the first chamber 10 is greater than the pressure in the second chamber 50. The second substrate 38 includes a solder contact or an engagement surface 56 for contacting the engagement portion 54 of the solder reservoir. Preferably the solder contact or engagement surface 56 is the upper face of the UBM 48 or a contact or upon pad on the second substrate 38 or semiconductor wafer 40.

Figure 2B:
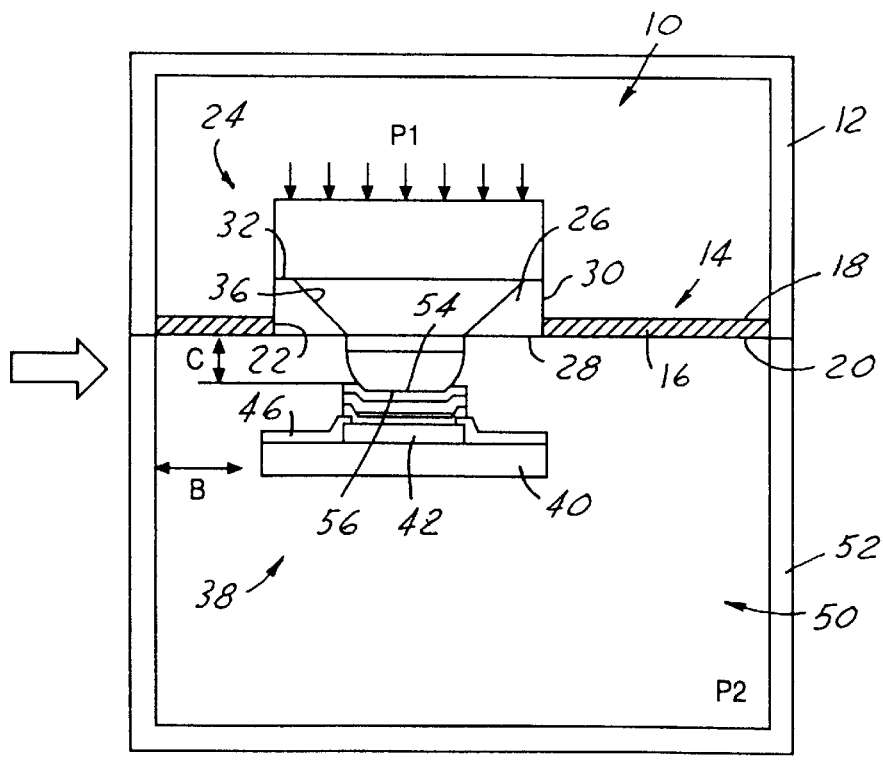
FIG. 2B is an enlarged, sectional view illustrating the engagement of the solder reservoir with the semiconductor wafer according to the present invention.

As shown if FIG. 2B, once the carrier 14 is aligned with the second substrate 38, the solder reservoir 24 is brought into contact with the second substrate 38. Preferably the engagement portion 54 of the solder reservoir contacts the solder contact or engagement surface 56 of the second substrate 38.

Once the solder reservoir has made contact with the second substrate 38, preferably the second substrate 38 is vibrated or oscillated in a horizontal direction (as indicated by arrows B) at an ultrasonic frequency and in a direction generally parallel to the plane of the second substrate 38 to start the reflow of the solder. As shown in FIG. 2B, preferably a gap (as indicated by arrow B) is provided between the lower face 20 of the carrier 14 and the engagement surface 56 of the second substrate 38. This allows the second substrate 38 to be vibrated or oscillated in a horizontal direction parallel to the plane of the second substrate without damaging the same. At this stage in the process, preferably the pressure and temperature in the first chamber 10 are each greater than the corresponding pressure and temperature in the second chamber 50. The second substrate 38 is oscillated in a horizontal direction for a brief period of time but sufficient to start the reflow of solder and thereafter the horizontal oscillation is stopped.

Figure 2C:
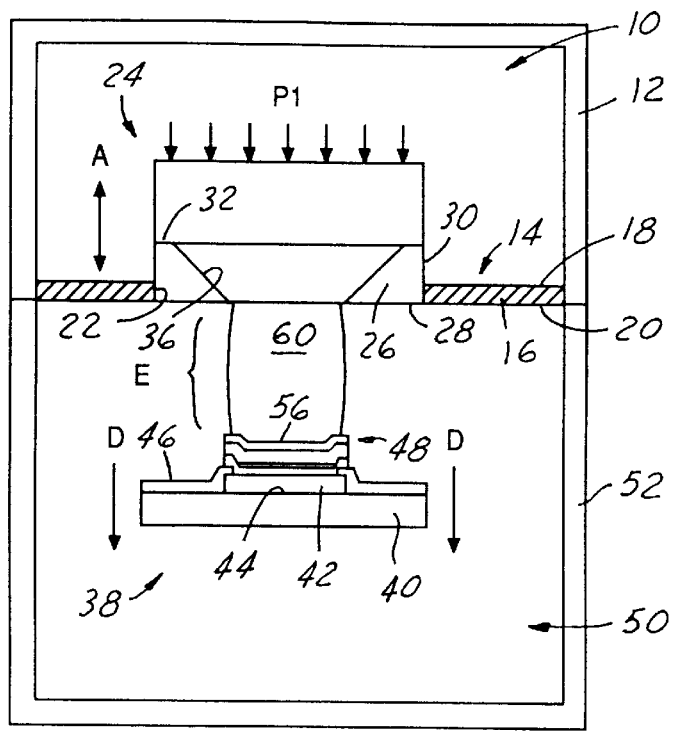
FIG. 2C is an enlarged, sectional view illustrating the growth of a solder column on the semiconductor wafer according to the present invention.

As shown in FIG. 2C, the solder reservoir carrier continues to be vibrated or oscillated in a vertical direction (as shown by arrow A) and pressure continues to be applied to the solder reservoir at the same time the second substrate 38 (semiconductor wafer 40) is moved away (and a direction shown by arrows D) from the solder reservoir carrier 14 to allow for additional solder to be deposited and a solder column 60 to be grown or formed on the second substrate 38 (semiconductor wafer 40). The solder column 60 may be grown to a height above the engagement surface 54 (indicated by E) that may be greater than 100 micrometers. Preferably the semiconductor wafer 40 is moved away from the carrier at a rate ranging from about 1 to about 100 micrometers per second. During this stage of the process the pressure in the first chamber 10 continues to be greater than the pressure in the second chamber 50.

Figure 2D:
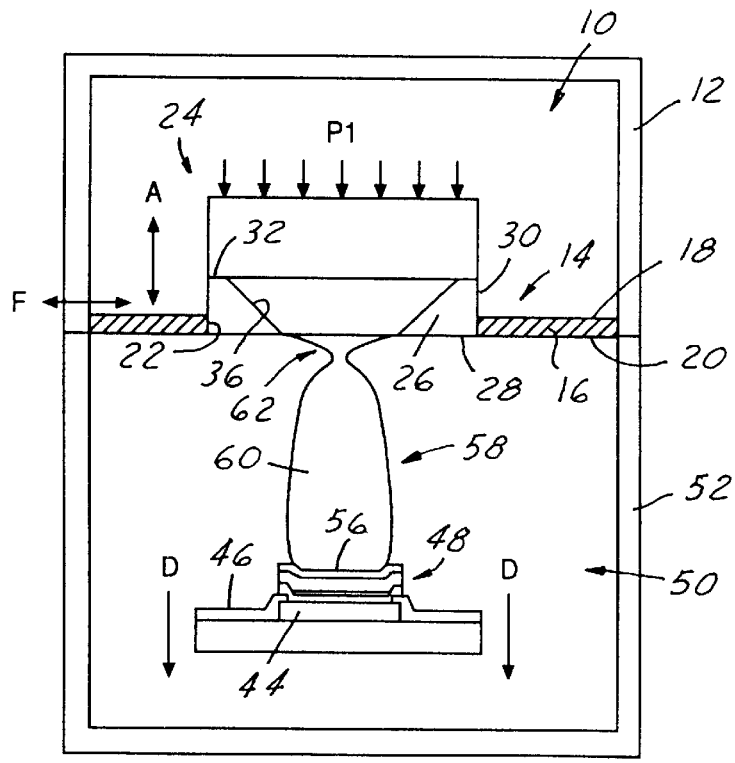
FIG. 2D is an enlarged, sectional view illustrating the cutting off of the solder column from the solder reservoir to form a solder bump according to the present invention.

As shown in FIG. 2D, once the solder column 16 is grown to a desired height, the solder reservoir carrier 14 is oscillated in both a vertical direction (indicated by arrow A) and a horizontal direction (indicated by arrow F). Preferably the pressure in the first chamber 10 is reduced and the pressure in the second chamber 50 is increased to greater than one atmosphere to five atmospheres. At the same time the second substrate 38 (semiconductor wafer 40) continues to be moved away from the carrier 14 in the direction D. As a result, a necked-down portion 62 forms between the solder reservoir 24 and the solder column 60 and ultimately the solder column 60 is cut off from the solder reservoir 24 and to form a solder bump 58. Alternatively, the solder column 60 may be cut off from the solder reservoir 24 by oscillating the second substrate 38 in a horizontal direction. Preferably the oscillation of the solder reservoir carrier 14 and the semiconductor wafer 40 are performed at least 20,000 oscillations per second and preferably greater than 100,000 oscillations per second over a distance of less than one micrometer.

What is claimed is:

1. A process comprising:
   providing a solder reservoir and a substrate having a solder contact thereon;
   aligning the solder reservoir with the solder contact;
   depositing solder from the solder reservoir onto the solder contact comprising the steps of oscillating the solder reservoir at an ultrasonic frequency;
   moving the substrate and the solder reservoir further away from each other while continuing to carry out the step of oscillating the solder reservoir at an ultrasonic frequency so that a solder column is formed on the solder contact; and
   cutting the solder column off from the solder reservoir by said movement of the substrate and the solder reservoir further away from each other to form a solder bump on the solder contact on the substrate.

2. A process as set forth in claim 1 further comprising the step of providing a solder reservoir carrier having a generally flat configuration and having an upper face and a lower face and an aperture formed therethrough, and wherein at least a portion of the solder reservoir is received in the aperture, and the step of oscillating the solder reservoir is carried out by oscillating the solder reservoir carrier.

3. A process as set forth in claim 2 wherein the step of providing a solder reservoir further comprises providing an engagement portion of the solder reservoir extending below the lower face of the solder reservoir carrier.

4. A process as set forth in claim 1 wherein the substrate has a substantially flat configuration and wherein the step of cutting off the solder column from the solder reservoir comprises oscillating the substrate at an ultrasonic frequency in a horizontal direction generally parallel with the plane of the substrate.

5. A process as set forth in claim 1 further comprising the step of applying pressure to the solder reservoir while carrying out the step of oscillating the solder reservoir at an ultrasonic frequency.

6. A process as set forth in claim 1 wherein the set a reservoir comprises a solder paste including lead and tin.

7. A process has set forth in claim 1 further comprising a plurality of solder reservoirs, and wherein the substrate includes a plurality of solder contacts and wherein each solder reservoir has an associated solder contact for carrying out the steps of aligning and depositing.

8. A process as set forth in claim 1 wherein the step of moving the solder reservoir carrier and the substrate away from each other is carried out at rate of about 1–100 millimeters per second.

9. A process as set forth in claim 1 further comprising a solder mask having a tapered through hole and wherein at least a portion of the solder reservoir is received in the through hole.

10. A process as set forth and claim 2 wherein the second substrate comprises a semiconductor wafer.

11. A process as set forth in claim 2 wherein the second substrate comprises a semiconductor wafer and the solder contact comprises a contact pad formed on the semiconductor wafer and an under bump metallurgy over the contact pad.

12. A process comprising:
   providing a solder reservoir carrier comprising a first substrate having a generally flat configuration and having an upper face and the lower face and an aperture form through the first substrate, and a solder mask having at least a portion received in the aperture and having a lower face and a funnel shaped through hole formed through the mask and extending through the lower face of the mask; a solder reservoir having at least a portion received in the funnel shaped through hole of the mask and having an engagement portion extending below the lower face of the mask; a second substrate having a solder contact thereon;

aligning the engagement portion with the solder contact;

oscillating the solder reservoir carrier at an ultrasonic frequency and in a vertical direction generally perpendicular to the plane of the first substrate;

contacting the engagement portion of the solder reservoir with the solder contact on the second substrate;

oscillating the second substrate to at an ultrasonic frequency and in a horizontal direction generally parallel with the plane of the second substrate to reflow portion of the solder reservoir onto the solder contact of the second substrate;

ceasing the oscillation of the second substrate;

moving the solder reservoir carrier and the second substrate further away from each other and continuing the step of oscillating the solder reservoir carrier in a vertical direction so that additional solder is deposited on the second substrate and a solder column is formed on the solder contact; and cutting off the solder column from the solder reservoir to form a solder bump on the solder contact.

13. A process as set forth in claim 12 wherein to step of cutting off the solder column comprises oscillating the solder reservoir carrier in the horizontal direction generally parallel with the plane of the solder reservoir carrier.

14. A process as set forth in claim 13 wherein the step of cutting off the solder column from the comprises applying pressure to the solder column.

15. A process as set forth in claim 10 further comprising the step of applying pressure to the solder reservoir while carrying out the step of oscillating the solder reservoir carrier in a vertical direction.

16. A process as set forth and claim 10 further comprising the step of heating the solder reservoir while carrying out the step of oscillating the solder reservoir carrier in a vertical direction.

17. A process as set forth in claim 10 wherein the step of moving the solder reservoir carrier and the second substrate away from each other is carried out at rate of about 1–100 micrometers per second.

18. A process as set forth in claim 10 wherein the step of cutting off the solder column from the solder reservoir comprises oscillating the solder reservoir carrier at an ultrasonic frequency and in both a vertical and a horizontal direction.

19. A process as set forth in claim 10 wherein the solder reservoir comprises a solder paste.

20. A process as set forth in claim 10 wherein the solder reservoir comprises a solder paste including lead and tin.

21. A process comprising:

providing a solder reservoir carrier comprising a first substrate having a generally flat configuration and having an upper face and a lower face and aperture formed through the first substrate; a solder mask having at least a portion received in the aperture and having a lower face and a funnel shaped through hole formed through the mask and extending through the lower face the mask; a solder reservoir having at least a portion received in the funnel shaped through hole of the mask and having an engagement portion extending below the lower face of the mask; and a semiconductor wafer having a solder contact thereon; a first process chamber defined by a first set of walls, and a second process chamber defined by a second set of walls and wherein the solder reservoir carrier is received in the first process chamber and a semiconductor wafer is received in the second process chamber;

aligning the solder reservoir carrier with the semiconductor wafer so that the engagement portion of the solder reservoir overlies the solder contact on the semiconductor wafer;

oscillating the solder reservoir carrier at an ultrasonic frequency and in a direction generally perpendicular to the plane of the first substrate;

applying pressure to the solder reservoir comprising the steps of increasing the pressure in the first process chamber;

contacting the engagement portion of the solder reservoir with the solder contact on the semiconductor wafer;

oscillating the semiconductor wafer at an ultrasonic frequency and in a horizontal direction generally parallel with the plane of the semiconductor wafer to reflow a portion of the solder reservoir onto the solder contact on the semiconductor wafer;

ceasing the step of oscillating the semiconductor wafer;

moving the semiconductor wafer away from the solder reservoir carrier and continuing the steps of oscillating the solder reservoir carrier in a vertical direction and applying pressure to the solder reservoir so that additional solder is deposited on the semiconductor wafer and a solder column is formed on the solder contact; and cutting off the solder column from the solder reservoir to form a solder bump on the solder contact comprising the steps of oscillating the solder reservoir carrier in both a vertical and horizontal direction, reducing the pressure in the first process chamber and increasing the pressure in the second process chamber and so that the pressure in the second process chamber is greater than the pressure in the first process chamber.

22. A process as set forth in claim 21 wherein the solder reservoir comprises a solder paste comprising lead and tin.

23. A process as set forth in claim 21 wherein the step of moving the semiconductor wafer away from the solder reservoir carrier is carried out at a rate ranging from about 1–100 micrometers per second.

* * * * *